(12) United States Patent
Park et al.

(10) Patent No.: US 8,327,534 B2
(45) Date of Patent: Dec. 11, 2012

(54) METHOD OF FABRICATING PRINTED CIRCUIT BOARD ASSEMBLY

(75) Inventors: Min Young Park, Suwon-si (KR); Young Jun Moon, Hwaseong-si (KR); Hyun Joo Han, Suwon-si (KR); Gyun Heo, Seoul (KR); Kyung Woon Jang, Suwon-si (KR); Sang il Hong, Suwon-si (KR); Dong Seok Baek, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 11 days.

(21) Appl. No.: 12/926,923

(22) Filed: Dec. 17, 2010

(65) Prior Publication Data

US 2011/0154661 A1      Jun. 30, 2011

(30) Foreign Application Priority Data

Dec. 30, 2009   (KR) .......................... 10-2009-0133496

(51) Int. Cl.
*H01K 3/10*         (2006.01)

(52) U.S. Cl. ................. 29/852; 29/830; 29/831; 29/834
(58) Field of Classification Search .................... 29/830, 29/831, 834, 852
See application file for complete search history.

(56) References Cited

U.S. PATENT DOCUMENTS

| 7,765,686 | B2 * | 8/2010 | Murakami et al. | .............. 29/831 |
| 2009/0025215 | A1 * | 1/2009 | Murakami et al. | .............. 29/846 |

FOREIGN PATENT DOCUMENTS

WO      2006/098207 A1 *   9/2006

* cited by examiner

*Primary Examiner* — Carl Arbes
(74) *Attorney, Agent, or Firm* — Harness, Dickey & Pierce, P.L.C.

(57) ABSTRACT

Disclosed herein is a method for fabricating a printed circuit board assembly by adhering an element to a printed circuit board without using any solder. The printed circuit board may be fabricated by sequentially applying a conductor-containing first ink and an insulator-containing second ink onto a base substrate by ink-jet printing to form a printed circuit board, mounting an element on the printed circuit board such that an electrode of the element contacts a conductive layer and curing the conductive layer at a high temperature.

12 Claims, 18 Drawing Sheets

US 8,327,534 B2

METHOD OF FABRICATING PRINTED CIRCUIT BOARD ASSEMBLY

CROSS-REFERENCE TO RELATED APPLICATION(S)

This application claims priority under 35 §U.S.C. 119 to Korean Patent Application No. 2009-0133496, filed on Dec. 30, 2009 in the Korean Intellectual Property Office, the entire contents of which is herein incorporated by reference.

BACKGROUND

1. Field

Example embodiments relate to a method for fabricating a printed circuit board assembly using ink-jet printing.

2. Description of the Related Art

The recent trend toward miniaturization of electric products has brought about integration of electronic devices, for example, semiconductors. As a result, there is a need for the fabrication of slim and highly-integrated printed circuit boards (PCBs). Printed circuit boards are generally fabricated by lithography using etching. Such a fabrication method provides formation of conductive lines by placing a conductive film on a substrate and etching an unnecessary portion of the conductive film to dissolution-remove a portion of the conductive film, where there are not circuits, with a corrosion solution and thereby to leave only necessary conductive lines.

In addition, in order to improve integration, multi-layered printed circuit boards are fabricated. The fabrication of multi-layered printed circuit boards requires complicated processes including drilling to form through or via holes in order to enable conduction between multilayer boards, laminating the boards and soldering to adhere elements to the printed circuit board. When soldering is performed in order to adhere elements to the printed circuit board, a region, where a solder is melted and spread, is further required and the elements are thus located in an area wider than the size of elements, themselves, thus limiting miniaturization.

SUMMARY

Example embodiments provide a method for fabricating a printed circuit board assembly, including forming a conductive layer and an insulating layer on a base substrate to produce a printed circuit board, mounting elements on the printed circuit board and curing the resulting structure. Example embodiments will be set forth in part in the description which follows and, in part, will be obvious from the description, or may be learned by practice of example embodiments.

In accordance with example embodiments, a method of fabricating a printed circuit board assembly may include forming a conductive layer on a base substrate by applying a conductor-containing first ink onto the base substrate. In example embodiments, the conductive layer may form a circuit pattern. The method may also include placing an element on the conductive layer and curing the conductive layer to adhere the element to the base substrate.

In accordance with example embodiments a method for fabricating a printed circuit board assembly may include applying a conductor-containing first ink onto a base substrate to form a first conductive layer for a formation of a circuit pattern, applying an insulator-containing second ink onto the base substrate having the first conductive layer to form an insulating layer, applying the first ink onto the base substrate having the first conductive layer and the insulating layer to form a second conductive layer, the second conductive layer being formed to electrically connect the first conductive layer to an element, placing the element on the base substrate provided with the first conductive layer, the insulating layer and the second conductive layer such that an electrode of the element contacts the second conductive layer, and curing the second conductive layer to adhere the element to the base substrate provided with the first conductive layer, the insulating layer and the second conductive layer.

In accordance with example embodiments, a method for fabricating a printed circuit board assembly may include applying a conductor-containing first ink onto a base substrate to form a conductive layer for the formation of a circuit pattern, mounting an element on the base substrate provided with the conductive layer such that the element contacts the conductive layer, and curing the conductive layer to adhere the element to the base substrate provided with the conductive layer.

The formation of the conductive layer may be carried out by applying the first ink onto the base substrate by ink-jet printing.

The curing of the conductive layer may be carried out by heating the conductive layer to a high temperature.

The method may further include applying an insulator-containing second ink onto the base substrate to form an insulating layer, before mounting the element on the base substrate.

The formation of the insulating layer may be carried out by applying the ink onto the base substrate by ink-jet printing.

The method may further include heating the insulating layer to a high temperature to cure the insulating layer.

The insulating layer may be formed to a thickness equivalent to or higher than that of the conductive layer.

In accordance with example embodiments, a method for fabricating a printed circuit board assembly may include applying a conductor-containing first ink onto a base substrate to form a first conductive layer for the formation of a circuit pattern; applying an insulator-containing second ink onto the base substrate provided with the first conductive layer to form an insulating layer, applying the first ink onto the base substrate provided with the first conductive layer and the insulating layer to form a second conductive layer electrically connecting the first conductive layer to the element, mounting the element on the base substrate provided with the first conductive layer, the insulating layer and the second conductive layer such that an electrode of the element contacts the second conductive layer, and curing the second conductive layer to adhere the element to the base substrate provided with the first conductive layer, the insulating layer and the second conductive layer.

The formation of the first conductive layer, the insulating layer or the second conductive layer may be carried out by applying the ink onto the base substrate by ink-jet printing.

The curing of the second conductive layer may be carried out by heating the second conductive layer to a high temperature.

The method may further include heating the first conductive layer or the insulating layer to cure the first conductive layer or the insulating layer.

The insulating layer may be formed to a thickness equivalent to or higher than that of the conductive layer.

BRIEF DESCRIPTION OF THE DRAWINGS

These and/or other aspects of example embodiments will become apparent and more readily appreciated from the following description of example embodiments, taken in conjunction with the accompanying drawings of which.

DETAILED DESCRIPTION

Figure 1:
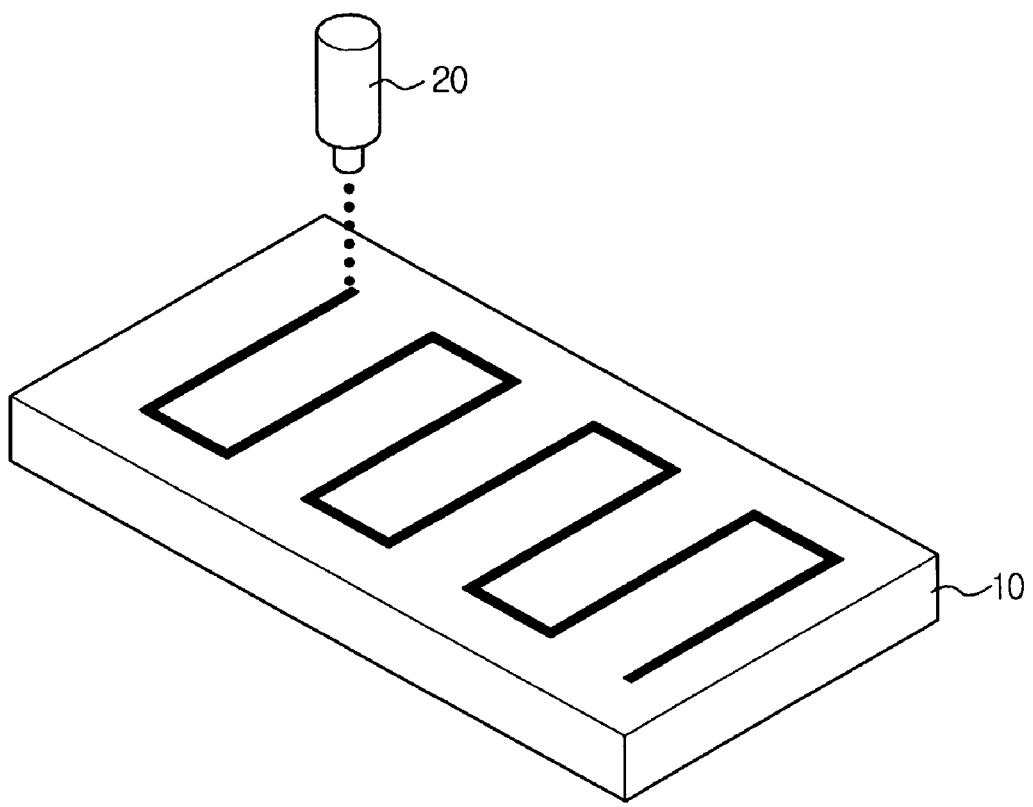
FIG. 1 is a perspective view illustrating forming a circuit pattern on a base substrate by ink-jet printing in accordance with example embodiments.

Example embodiments will now be described more fully with reference to the accompanying drawings, in which example embodiments are shown. The invention may, however, be embodied in different forms and should not be construed as limited to example embodiments set forth herein. Rather, example embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Reference will now be made in detail to the example embodiments which are illustrated in the accompanying drawings, wherein like reference numerals refer to like elements throughout.

FIG. 1 is a perspective view illustrating a forming of a circuit pattern on a base substrate 10 by ink-jet printing in accordance with a method for fabricating a printed circuit board assembly according to example embodiments.

The base substrate 10 and inkjet head 20 are shown in FIG. 1. The base substrate 10 may be a metal plate and may be a basis for a printed circuit board (PCB) completed by forming a layer with a first ink 30 and a second ink 40. The inkjet head 20 may serve to apply ink in a desired pattern through a control portion (not shown). Hereinafter, the method for fabricating a printed circuit board assembly will be described with reference to FIGS. 2A to 2F and FIGS. 3A to 3I in detail.

FIGS. 2A to 2F are views illustrating a process for adhering an element 60 to a mono-layer printed circuit board in accordance with the method for fabricating a printed circuit board assembly of example embodiments.

Figure 2A:
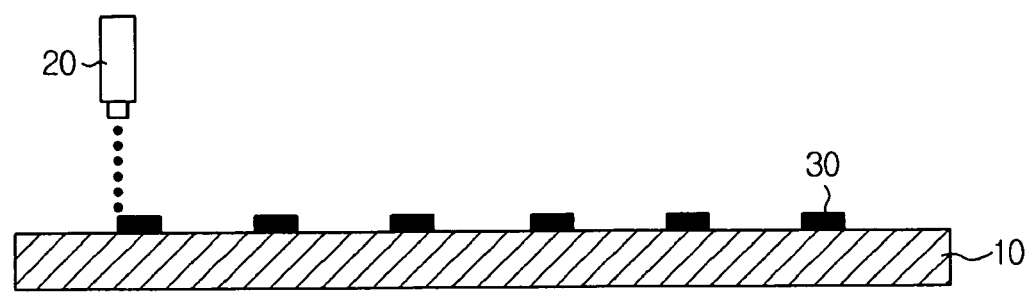
FIGS. 2A to 2F are views illustrating a process for adhering an element to a mono-layer printed circuit board in accordance with example embodiments.

FIG. 2A shows applying a conductor-containing first ink 30 with an inkjet head 20 to form a conductive layer in order to form a circuit pattern on a base substrate 10. The first ink 30 may be a viscous and flowable liquid. The first ink 30 may comprise a mixture including a first substance and a second substance. The first substance may include a conductor, for example, silver or copper. The second substance may include a polymer. As mentioned above, the inkjet head 20 may serve to apply the first ink 30 in a desired pattern through a control portion (not shown).

Figure 2B:
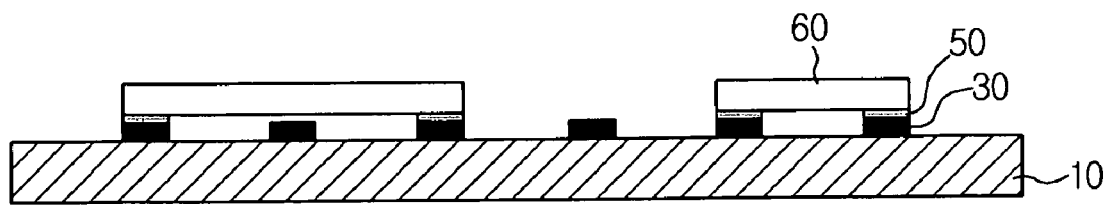

FIG. 2B shows a process for mounting element 60 such that an electrode 50 of the element 60 contacts the conductive layer (the first ink 30) formed in FIG. 2A. In example embodiments, the conductive layer formed in FIG. 2A may be cured to adhere the element 60 to the base substrate 10. The curing of the conductive layer may be carried out by heating the conductive layer to a high temperature of about 200° C. The heating causes volatile substances of the conductive layer to be vaporized and the polymer thereof to be cured. The curing of the conductive layer made from the first ink 30 provides formation of electrically conductive circuit patterns through a conductor, for example, silver of copper, that may be present in the first ink 30. That is, the element 60 may be adhered to the printed circuit board in a very simple manner using adhesion caused by the curing of the conductive layer made from the first ink 30 without additional operation such as soldering.

Although FIG. 2B illustrates direct adhesion of the element 60 to the conductive layer made from the first ink 30 on the base substrate 10, an insulating layer may be further formed with a second ink 40. In example embodiments, the insulating layer may be formed prior to mounting the element 60. This will be described with reference to FIGS. 2C to 2F in detail.

Figure 2C:
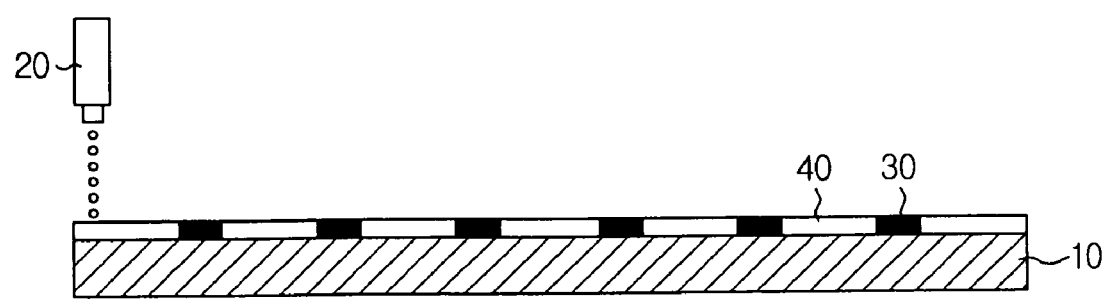

FIG. 2C illustrates applying an insulator-containing second ink 40 to a vacant area around the conductive layer made from the first ink 30 to form an insulating layer. In example embodiments, the insulating layer may be formed, after the process of FIG. 2A, however, example embodiments are not limited thereto as the insulating layer may be formed along with, or before, the formation of the conductive layer. The second ink 40 may contain an insulator and may be a viscous, flowable liquid. The inkjet head 20 may apply the second ink 40 to a desired region through the control portion (not shown) to form an insulating layer. Although FIG. 2C illustrates formation of the insulating layer realized by applying the second ink 40 to the same height as the conductive layer in an entire vacant area around the conductive layer, the second ink 40 may cover a portion of the conductive layer, or the second ink 40 may be applied to a height higher than that of the conductive layer according to design specifications. However, to efficiently connect the electrically-conductive conductive layer to the element 60, the insulating layer formed with the second ink 40 may be formed generally to a height identical to or lower than that of the conductive layer. As a result of this process, a first layer including the conductive layer and the insulating layer may be formed on the base substrate 10.

Figure 2D:
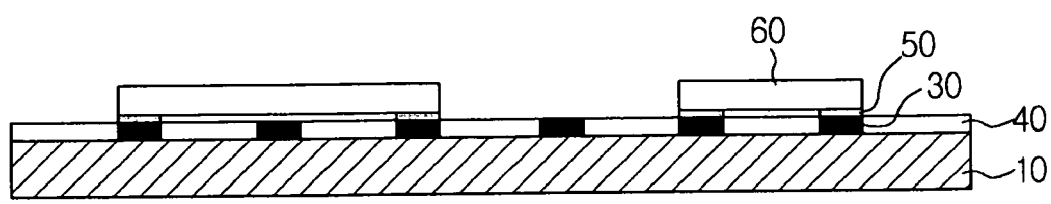

FIG. 2D illustrates a process for mounting the element 60 on the base substrate 10 provided with the first layer (the first layer including the conductive layer and the insulating layer). According to design specifications, the element 60 may be mounted on the base substrate 10 provided with the first layer such that the electrode 50 of the element 60 contacts a desired region of the conductive layer. When the element 60 is mounted on the base substrate 10, the conductive layer may be cured by heating to a high temperature of about 200° C. to adhere the element 60 to the base substrate 10, as mentioned above. In the case of the first layer including the conductive layer and the insulating layer, the insulating layer may be cured by simultaneously heating the conductive and insulating layers.

As shown in FIG. 2D, the element 60 may be directly adhered to the base substrate 10 provided with the first layer. When the conductive layer is provided to form a complicated circuit pattern, or the electrode 50 of the element 60 cannot be connected to the conductive layer provided in the first layer due to factors such as the size of the element 60, another conductive layer may be further formed by applying the first ink 30 onto the first layer. Hereinafter, this will be described with reference to FIGS. 2E and 2F.

Figure 2E:
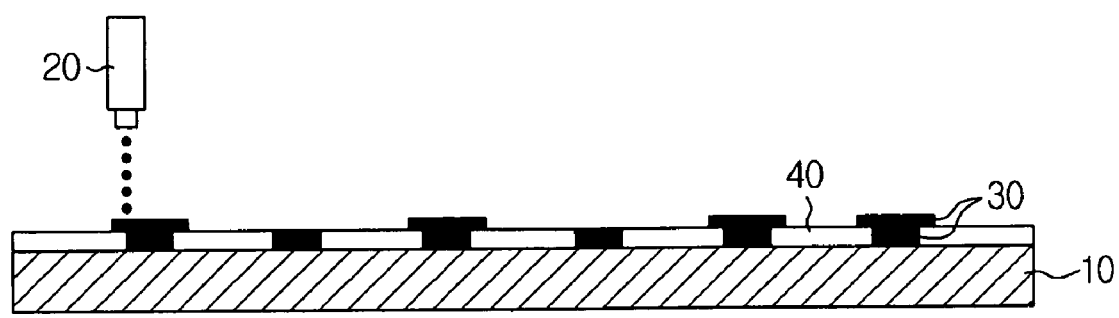
Figure 2F:
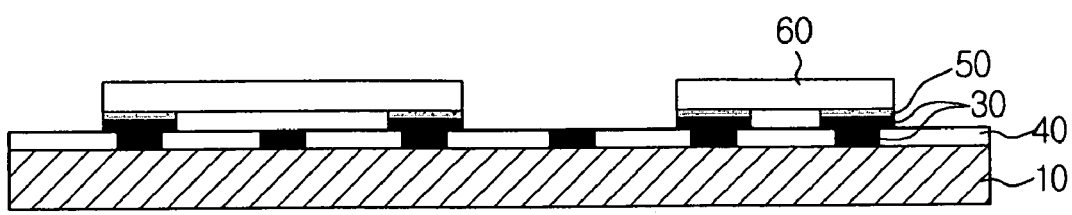

FIG. 2E illustrates applying the first ink 30 onto the base substrate 10 provided with the first layer formed in FIG. 2C to further form another conductive layer. As shown in FIG. 2E, the first ink 30 may be selectively applied only onto areas (e.g., first, third, fifth and sixth conductive layers in this order from the left) required to mount the element 60, to further form another conductive layer. After the formation of the additional conductive layer, as shown in FIG. 2F, the element 60 may be mounted on the base substrate 10 including the first layer and additional conductive layer, such that the electrode 50 of the element 60 contacts the additional conductive layer. Then, the additional conductive layer may be cured. In example embodiments, the additional conductive layer may be cured by heating the additional conductive layer to a temperature of about 200° C., to adhere the element 60 to the base substrate 10. The adhering of the element 60 to the base substrate 10 may be carried out by heating the first layer to a relatively high temperature, curing the same, mounting the element 60 on the base substrate 10 and then curing the additional conductive layer through heating to the relatively high temperature. Example embodiments, however, are not limited thereto. For example, the element 60 may be mounted on the base substrate 10 and then the first layer and additional conductive layer may be cured by simultaneously heating the first layer and the additional layer. Hereinbefore, a process for adhering the element to a mono-layer printed circuit board has been described. Hereinafter, a process for adhering an element to a multi-layer printed circuit board will be described.

FIGS. 3A to 3I are views illustrating a process for adhering an element to a multi-layer printed circuit board in accordance with the method for fabricating a printed circuit board assembly of example embodiments.

Figure 3A:
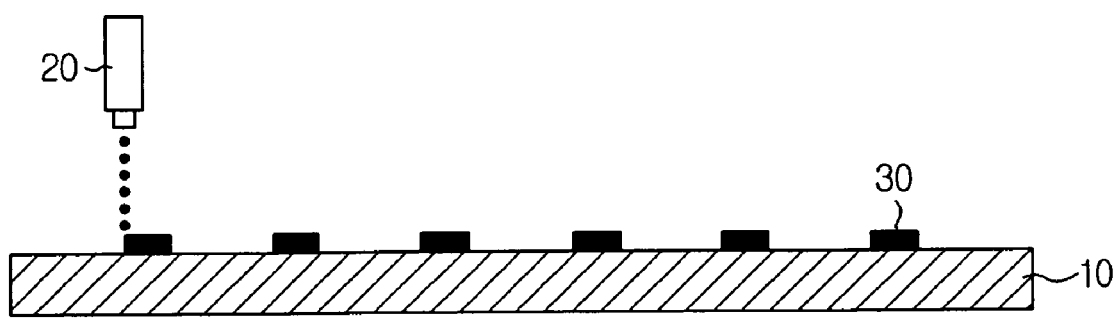
FIGS. 3A to 3I are views illustrating a process for adhering an element to a multi-layer printed circuit board in accordance with example embodiments.
Figure 3B:
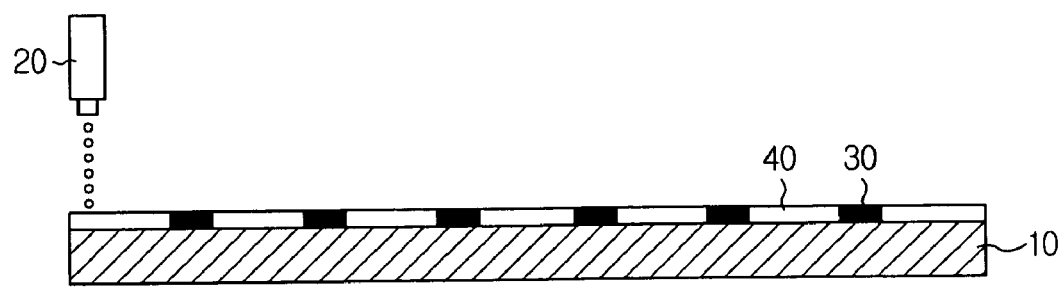
Figure 3C:
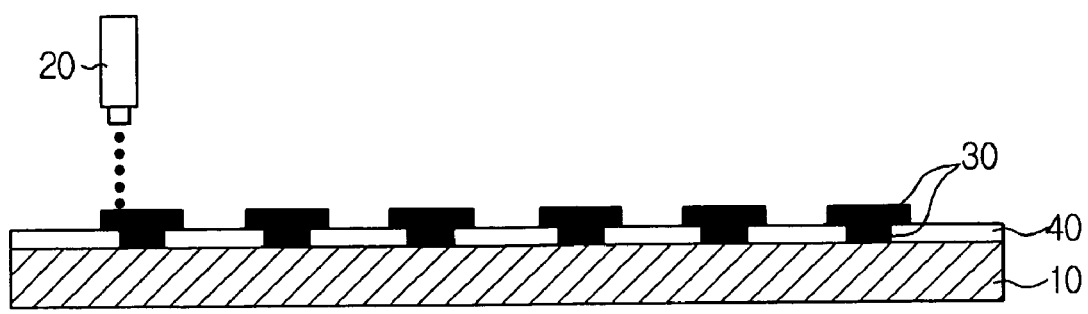
Figure 3D:
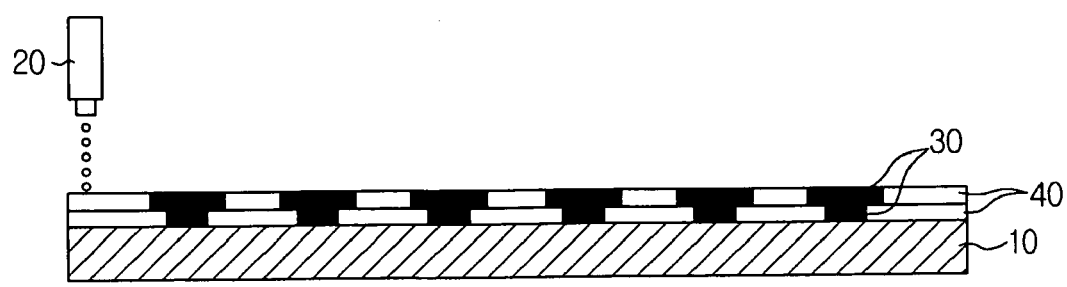

FIGS. 3A to 3C illustrate the processes that may be the same as the processes illustrated in FIGS. 2A, 2C and 2E, accordingly, an explanation thereof is omitted for the sake of brevity. FIG. 3D illustrates a process for applying an insulator-containing second ink 40 in a vacant area around the conductive layer to form an insulating layer. In example embodiments, the process for applying the insulator-containing second ink 40 may be performed after the process of FIG. 3C. As a result, a second layer may be formed on the first layer.

Figure 3E:
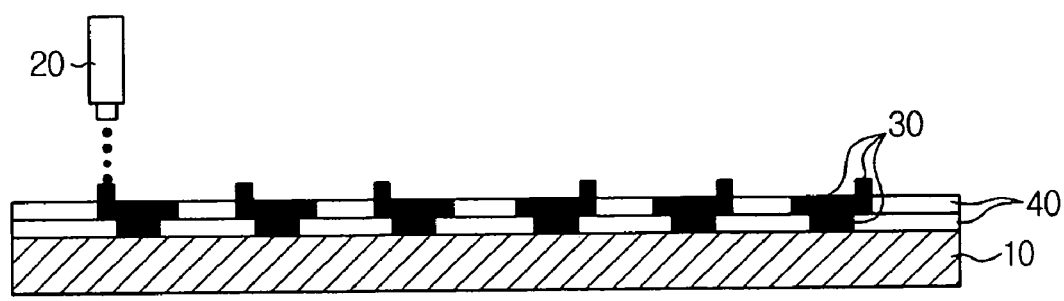
Figure 3F:
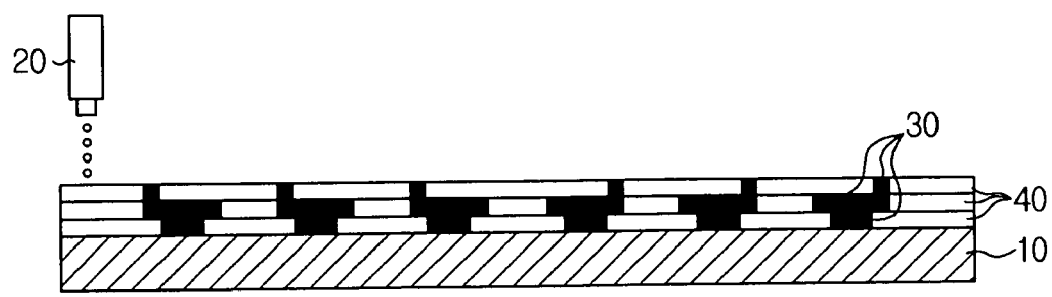

FIGS. 3E and 3F illustrate forming a conductive layer and an insulating layer on the second layer to form a third layer. That is, according to required design specifications, the first ink 30 of the third layer may be applied to form a conductive layer electrically connected to the conductive layer of the second layer and the second ink 40 may be applied in a vacant area around the first ink of the third conductive layer to form an insulating layer.

Figure 3G:
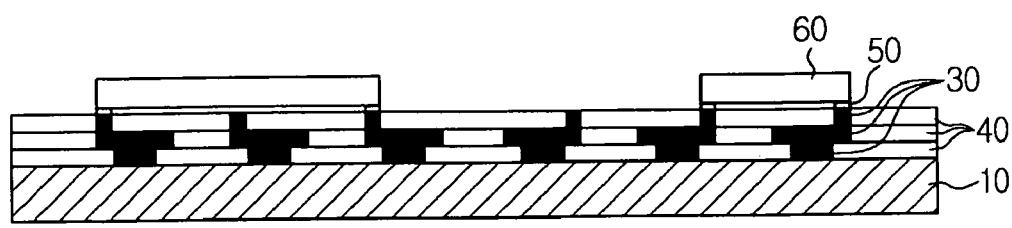

When the first, second and third layers are formed on the base substrate 10, they may be directly adhered to the element 60, or adhered thereto through another conductive layer. First, FIG. 3G illustrates directly mounting the element 60 on the base substrate 10 provided with the third layer. As shown in FIG. 3G, the element 60 may be mounted on the conductive layer of the third layer such that the electrode 50 of the element 60 contacts this conductive layer of the third layer, and the conductive layer of the third layer may be cured to adhere the element 60 to the base substrate 10 provided with the conductive layer of the third layer and the insulating layer of the third layer. The curing of the conductive layer of the third layer may be carried out by heating the conductive layer of the third layer to a temperature of about 200° C. The conductive layer and the insulating layer of the third layer may be simultaneously cured by simultaneously heating the conductive layer and the insulating layer. When the first layer, the second layer and the third layer are formed to provide a tri-layer structure, the three layers may be immediately cured after formation, or the three layers may be formed, the element 60 may be mounted thereon and the resulting structure may then cured simultaneously.

Figure 3H:
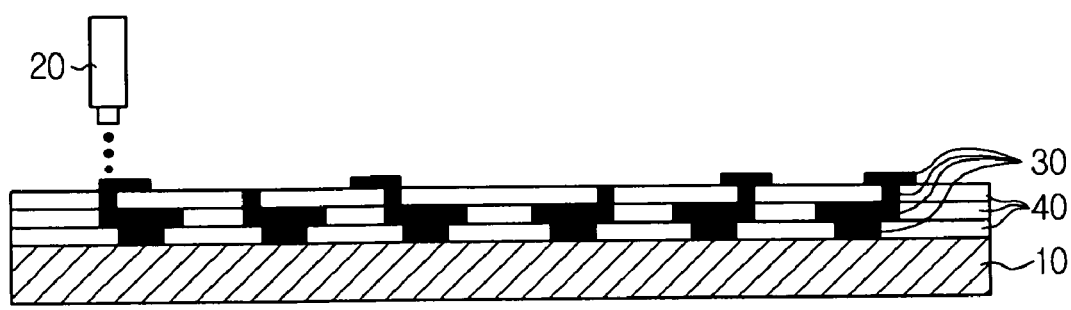
Figure 3I:
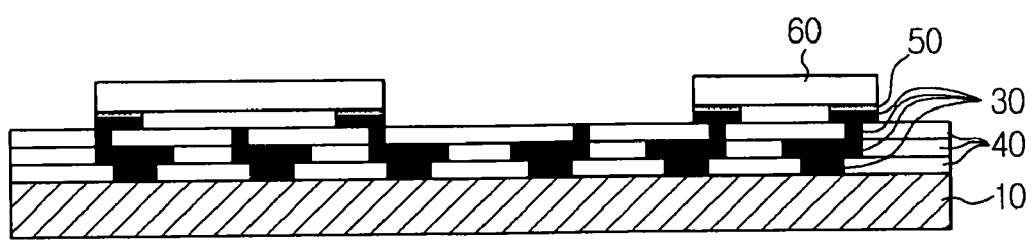

FIGS. 3H and 3I illustrate a process for forming another conductive layer on the base substrate 10 provided with the first, second and third layers, and then adhering the element 60 to the resulting structure. As illustrated in FIGS. 3H and 3I, the first ink 30 may be selectively applied only in areas (e.g., first, third, fifth and sixth insulating layers in this order from the left) required for mounting the element 60 to further form another conductive layer. After the formation of the additional conductive layer, the element 60 may be mounted on the base substrate 10 including the first, second, third and additional conductive layers, such that the electrode 50 of the element 60 contacts the additional conductive layer. Then, the conductive layer may be cured in the same manner as illustrated above to adhere the element 60 to the base substrate 10. A method for fabricating a printed circuit board assembly will be described broadly with reference to the flow charts of FIGS. 4 and 5.

Figure 4:
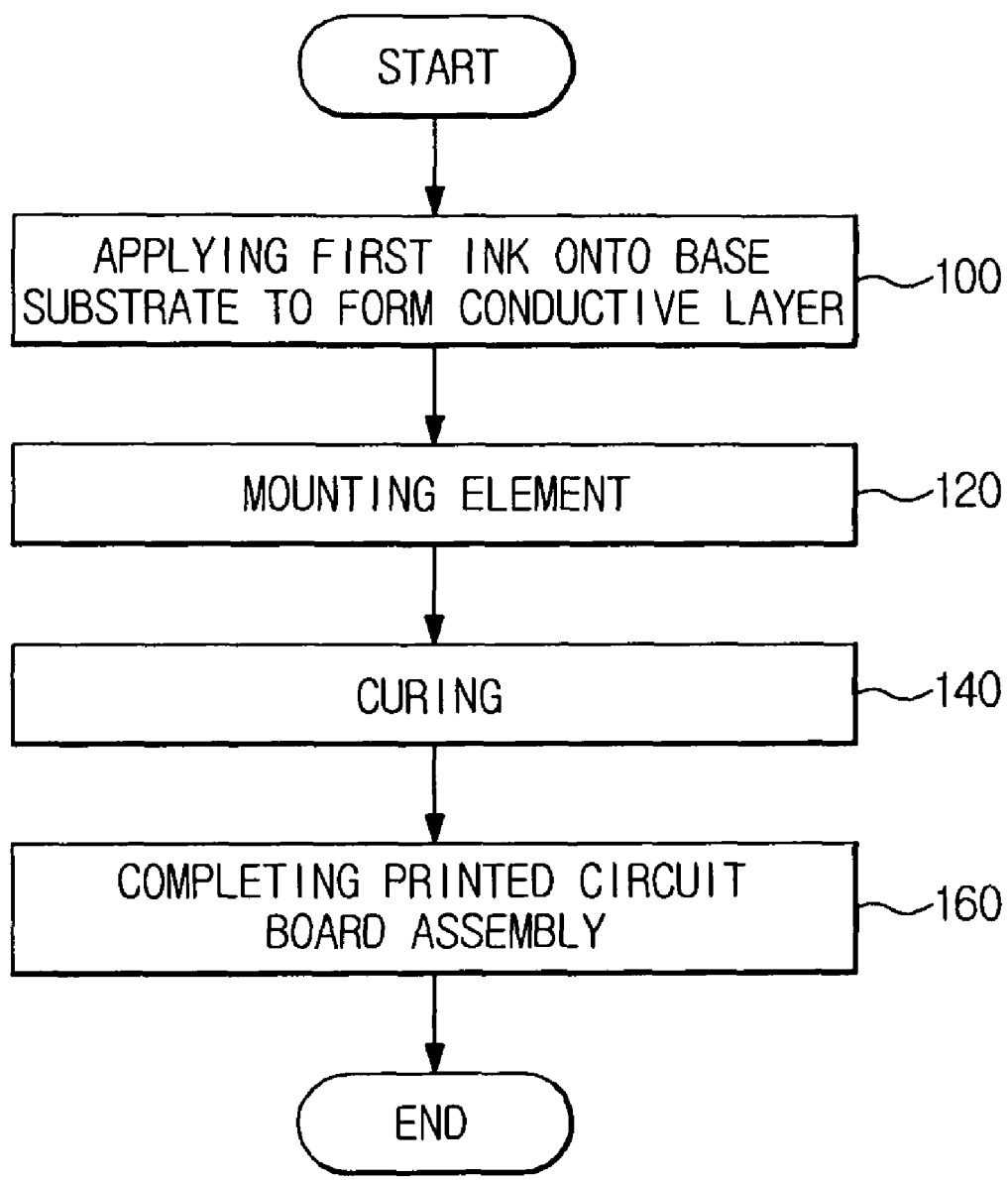
FIG. 4 is a flow chart illustrating a process for adhering an element to a mono-layer printed circuit board in accordance with example embodiments.

FIG. 4 is a flow chart illustrating a process for adhering an element to a monolayer printed circuit board in accordance with the method for fabricating the printed circuit board assembly of example embodiments.

As indicated in FIG. 4, a conductor-containing first ink 30 may be applied onto a base substrate 10 with an inkjet head 20 to form a conductive layer in order to form a circuit pattern on a base substrate 10 (100). After formation of the conductive layer on the base substrate 10, an element 60 may be mounted on the insulating layer such that an electrode 50 of the element 60 contacts the conductive layer (120). In example embodiments, the conductive layer may be cured to adhere the element 60 to the base substrate 10 provided with the conductive layer (140). As a result of this process, the fabrication of the printed circuit board assembly may be completed 160. As mentioned above, the element 60 may be directly adhered to the insulating layer formed with the first ink 30, the insulating layer may be further formed with the second ink 40 prior to mounting the element 60, or another conductive layer electrically connecting the conductive layer and the element may be further formed.

Figure 5:
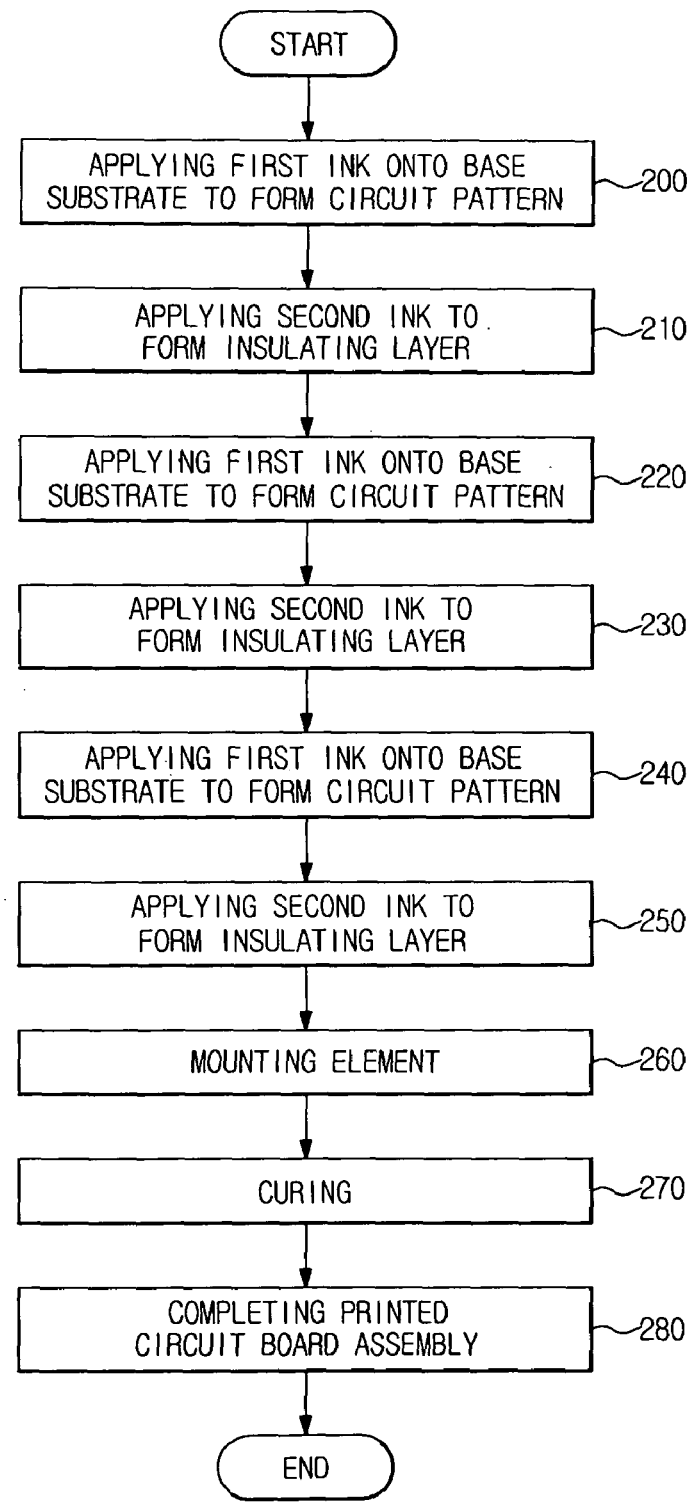
FIG. 5 is a flow chart illustrating a process for adhering an element to a multi-layer printed circuit board in accordance with example embodiments.

FIG. 5 is a flow chart illustrating a process for adhering an element to a multi-layer printed circuit board in accordance with the method for fabricating the printed circuit board assembly of example embodiments.

In particular, FIG. 5 illustrates a process for adhering an element to a tri-layer printed circuit board including a first layer, a second layer and a third layer. In example embodiments, a conductor-containing first ink 30 may be applied onto a base substrate 10 with an inkjet head 20 to form a conductive layer for the formation of a circuit pattern (200). In example embodiments, an insulator-containing second ink 40 may be applied thereon to form an insulating layer 210. As a result, a first layer is formed on the base substrate 10. In example embodiments, the conductor-containing first ink 30 may be applied thereon to form a conductive layer 220 and an insulator-containing second ink 40 may be applied thereon to form an insulating layer 230, thereby completing formation of a second layer. In example embodiments, the conductor-containing first ink 30 may be applied thereon in the same manner as illustrated above, to form a conductive layer (240) and the insulator-containing second ink 40 may be applied to form an insulating layer (250). As a result, formation of a third layer may be completed. In example embodiments, an element 60 may be mounted such that an electrode 50 of the element 60 contacts the conductive layer of the third layer (260). In example embodiments, the conductive layer may be cured to adhere the element 60 to the base substrate 10 (270). As mentioned in FIG. 4, another conductive layer may be further formed before mounting the element 60. Through this process, the element 60 may be adhered to the printed circuit board, to complete the printed circuit board assembly (280).

Based on the afore-mentioned configurations, a highly-integrated printed circuit board assembly can be fabricated as compared to printed circuit board assemblies fabricated using solders. In addition, not using solder advantageously eliminates the necessity of complicated processes, for example, a process for supplying a solder. In addition, the methods of forming a highly-integrated printed circuit board according to example embodiments may reduce fabrication costs.

Although example embodiments have been shown and described, it would be appreciated by those skilled in the art that changes may be made in example embodiments without departing from the principles and spirit of the invention, the scope of which is defined in the claims and their equivalents.

What is claimed is:

1. A method of fabricating a printed circuit board assembly, comprising:
    forming a conductive layer on a base substrate by applying a conductor-containing first ink onto the base substrate, the conductive layer forming a circuit pattern;
    placing an electrode of an element on the conductive layer such that the electrode and the conductive layer are electrically connected; and
    curing the conductive layer to adhere the electrode of the element to the base substrate.

2. The method according to claim 1, wherein forming the conductive layer includes applying the first ink onto the base substrate by ink jet printing.

3. The method according to claim 1, wherein curing the conductive layer includes heating the conductive layer.

4. The method according to claim 1, further comprising:
    forming an insulating layer by applying an insulator-containing second ink onto the base substrate, the second ink being applied before the placing an electrode of an element on the conductive layer.

5. The method according to claim 4, wherein forming the insulating layer includes applying the second ink onto the base substrate by ink-jet printing.

6. The method according to claim 4, further comprising:
    heating the insulating layer to cure the insulating layer.

7. The method according to claim 4, wherein the insulating layer is formed to a thickness equivalent to or less than that of the conductive layer.

8. A method for fabricating a printed circuit board assembly comprising:
    applying a conductor-containing first ink onto a base substrate to form a first conductive layer for a formation of a circuit pattern;
    applying an insulator-containing second ink onto the base substrate having the first conductive layer to form an insulating layer;
    applying the first ink onto the base substrate having the first conductive layer and the insulating layer to form a second conductive layer, the second conductive layer being formed to electrically connect the first conductive layer to an element;
    placing an electrode of the element on the second conductive layer such that the electrode and the second conductive layer are electrically connected; and
    curing the second conductive layer to adhere the electrode of the element to the base substrate provided with the first conductive layer, the insulating layer and the second conductive layer.

9. The method according to claim 8, wherein applying the conductor-containing first ink and the insulator-containing second ink includes applying the conductor-containing first ink and the insulator-containing second ink on the base substrate by ink-jet printing.

10. The method according to claim 8, wherein curing the second conductive layer includes heating the second conductive layer.

11. The method according to claim 8, further comprising:
    heating at least one of the first conductive layer and the insulating layer to cure at least one of the first conductive layer and the insulating layer.

12. The method according to claim 8, wherein applying the insulator-containing second ink onto the base substrate having the first conductive layer to form the insulating layer includes providing the insulator-containing second ink to have a thickness equivalent to or less than that of the first conductive layer.

* * * * *